US011811003B2

(12) United States Patent
Kuchiyama

(10) Patent No.: US 11,811,003 B2
(45) Date of Patent: Nov. 7, 2023

(54) TRANSPARENT ELECTRODE-EQUIPPED SUBSTRATE AND PRODUCTION METHOD THEREFOR

(71) Applicant: KANEKA CORPORATION, Osaka (JP)

(72) Inventor: Takashi Kuchiyama, Settsu (JP)

(73) Assignee: KANEKA CORPORATION, Osaka (JP)

( * ) Notice: Subject to any disclaimer, the term of this patent is extended or adjusted under 35 U.S.C. 154(b) by 520 days.

(21) Appl. No.: 17/162,642

(22) Filed: Jan. 29, 2021

(65) Prior Publication Data

US 2021/0151631 A1 May 20, 2021

Related U.S. Application Data

(63) Continuation of application No. PCT/JP2019/023566, filed on Jun. 13, 2019.

(30) Foreign Application Priority Data

Aug. 1, 2018 (JP) .................................. 2018-145082

(51) Int. Cl.
*H01L 33/42* (2010.01)
*H01L 31/0224* (2006.01)
*H01L 31/18* (2006.01)

(52) U.S. Cl.
CPC ...... *H01L 33/42* (2013.01); *H01L 31/022466* (2013.01); *H01L 31/1884* (2013.01); *H01L 2933/0016* (2013.01)

(58) Field of Classification Search
CPC ... C23C 14/086; C23C 14/3492; C23C 14/35; H01L 31/1884; H01L 31/022475;
(Continued)

(56) References Cited

U.S. PATENT DOCUMENTS

2005/0095809 A1* 5/2005 Nakayama .......... C23C 14/3464
438/454
2011/0272021 A1* 11/2011 Takahashi ........... H01L 31/1884
257/E31.13
(Continued)

FOREIGN PATENT DOCUMENTS

JP 2005-103768 A 4/2005
JP 2010-282785 A 12/2010
(Continued)

OTHER PUBLICATIONS

International Search Report issued in PCT/JP2019/023566; dated Aug. 27, 2019.

*Primary Examiner* — Alia Sabur
(74) *Attorney, Agent, or Firm* — Studebaker & Brackett PC

(57) ABSTRACT

A transparent electrode-equipped substrate includes, on a film base material having a transparent film substrate, a non-crystalline transparent foundation oxide layer and a non-crystalline transparent conductive oxide layer. The transparent electrode-equipped substrate is capable of achieving low resistivity by having the transparent oxide layers being formed sequentially from the film base material side through sputtering such that the absolute value of a discharge voltage ($V_U$) of a direct-current (DC) power supply when forming the transparent foundation oxide layer is 255-280 V, the ratio ($V_U/V_C$) between the discharge voltage ($V_U$) of the DC power supply when forming the transparent foundation oxide layer and the discharge voltage $V_C$ of the DC power supply when forming the transparent conductive oxide layer is 0.86-0.98.

17 Claims, 3 Drawing Sheets

(58) Field of Classification Search
CPC ............ H01L 31/022466; H10K 30/82; H10K 2102/103; C03C 2217/94
See application file for complete search history.

(56) References Cited

U.S. PATENT DOCUMENTS

| | | | |
|---|---|---|---|
| 2014/0141237 A1* | 5/2014 | Takeyasu | H01B 1/08 |
| | | | 428/336 |
| 2014/0370275 A1 | 12/2014 | Kuchiyama et al. | |
| 2015/0357076 A1* | 12/2015 | Sasa | H01B 1/08 |
| | | | 428/336 |
| 2016/0155531 A1 | 6/2016 | Kawakami et al. | |
| 2016/0160345 A1* | 6/2016 | Miyamoto | B32B 9/00 |
| | | | 428/480 |
| 2016/0351752 A1* | 12/2016 | Kuchiyama | C23C 14/5806 |
| 2017/0081754 A1* | 3/2017 | Hayakawa | G06F 3/041 |

FOREIGN PATENT DOCUMENTS

| | | |
|---|---|---|
| JP | 2016-031809 A | 3/2016 |
| JP | 2017-008380 A | 1/2017 |
| JP | 2017-071850 A | 4/2017 |
| WO | 2013/111681 A1 | 8/2013 |
| WO | 2013-115125 A1 | 8/2013 |
| WO | 2015/115237 A1 | 8/2015 |

\* cited by examiner

FLAT INTERFACE

UNEVEN INTERFACE

TRANSPARENT ELECTRODE-EQUIPPED SUBSTRATE AND PRODUCTION METHOD THEREFOR

This application claims benefit of priority to International Patent Application No. PCT/JP2019/023566, filed Jun. 13, 2019, and to Japanese Patent Application No. 2018-145082, filed Aug. 1, 2018, the entire contents of each are incorporated herein by reference.

BACKGROUND

Technical Field

The present application relates to a substrate with a transparent electrode and a method for producing a substrate with a transparent electrode.

Background Art

Substrates with transparent electrodes have been used for display devices such as touch panels or displays; smart windows such as light-control devices; light-emitting devices such as light-emitting diodes (LEDs); and light-receiving devices such as solar cells. For the substrates with transparent electrodes, an electrical characteristic represented as sheet resistance is important.

The transparent electrodes are generally known to be formed on film base materials by forming silicon oxide films as foundation layers as described in PCT International Publication No. WO2013/115125 or subjecting to a plasma treatment (bombardment treatment) with an inert gas as described in Japanese Unexamined Patent Application, Publication No. 2010-282785.

The film base materials may be those including inorganic compounds dispersed in coating layers, but generally are those mainly composed of polymeric compounds. For those film base materials derived from the polymeric compounds, surfaces of the film base materials are known to be physically or chemically modified by plasma.

With the recent improvement in device performance, it has been important to improve performance of films with transparent electrodes, in other words, to further decrease resistance of transparent electrodes. Unlike glass base materials, the polymeric compounds modified as described above, oligomeric components, or low-molecular weight components may diffuse into film-forming chambers or into transparent oxide layers after film formation in the case of film base materials, making it more difficult to decrease the resistance than for the glass base materials.

Furthermore, in the case of conventional formation of foundation layers or bombardment treatment, it is difficult to maintain flatness on surfaces of the film base materials, leading to formation of fine unevenness. Such fine unevenness has significant effects on transparent electrodes of several tens of nanometers to several hundreds of nanometers, and in particular, may adversely affect crystallinity of materials of the transparent electrodes, in other words, possibly making it difficult to decrease resistance of the materials of the transparent electrodes.

The present application is directed to solving the above-mentioned problems. That is, the present inventors have found that a percentage of crystallinity of a transparent oxide layer upon annealing is increased and an average grain size is increased to fall within a predetermined range by flattening a surface of a film base material, making it possible to decrease resistance.

SUMMARY

The present application relates to the following.

<1> A method for producing a substrate with a transparent electrode, the method including:
forming a transparent oxide layer on a film base material;
the film base material including a transparent film substrate, the transparent oxide layer including an amorphous transparent foundation oxide layer and an amorphous transparent conductive oxide layer formed sequentially on the film base material through a sputtering method,
an absolute value of a discharge voltage ($V_U$) when a direct-current (DC) power supply applies a voltage upon formation of the transparent foundation oxide layer being 255 V or more and 280 V or less and a ratio ($V_U/V_C$) of the discharge voltage ($V_U$) to a discharge voltage $V_C$ when the DC power supply applies a voltage upon formation of the transparent conductive oxide layer being 0.86 or more and 0.98 or less, and
an oxygen partial pressure upon formation of the transparent conductive oxide layer being higher than an oxygen partial pressure upon formation of the transparent foundation oxide layer.

<2> A method for producing a substrate with a transparent electrode, the method including:
forming a transparent oxide layer on a film base material;
the transparent oxide layer including an amorphous transparent foundation oxide layer and an amorphous transparent conductive oxide layer formed sequentially on the film base material through a sputtering method,
an absolute value of a discharge voltage ($V_U$) when a direct-current (DC) power supply applies a voltage upon formation of the transparent foundation oxide layer being 255 V or more and 280 V or less and a ratio ($V_U/V_C$) of the discharge voltage ($V_U$) to a discharge voltage $V_C$ when the DC power supply applies a voltage upon formation of the transparent conductive oxide layer being 0.86 or more and 0.98 or less, and
a ratio (Pu/Pc) of a film-forming pressure (Pu) upon formation of the transparent foundation oxide layer to a film-forming pressure (Pc) upon formation of the transparent conductive oxide layer satisfies a relational expression: $1.0 \leq Pu/Pc \leq 2.5$.

<3> The method for producing a substrate with a transparent electrode according to <1>, in which a ratio (Pu/Pc) of a film-forming pressure (Pu) upon formation of the transparent foundation oxide layer to a film-forming pressure (Pc) upon formation of the transparent conductive oxide layer satisfies a relational expression: $1.0 \leq Pu/Pc \leq 2.5$.

<4> The method for producing a substrate with a transparent electrode according to any of <1> to <3>, in which a film thickness (t1) of the transparent foundation oxide layer is 1.5% or more and 3.0% or less of a film thickness ($t_T$) of the transparent oxide layer.

<5> The method for producing a substrate with a transparent electrode according to any of <1> to <4>, in which the transparent oxide layer is formed by the sputtering method and then the substrate with a transparent electrode is crystallized through an annealing treatment, and in which the transparent oxide layer has an average grain size (Da), an average value of grain size when observed from a surface opposite to the film base material, of 1.5 times or more and 2.5 times or less the film thickness ($t_T$) of the transparent oxide layer.

<6> The method for producing a substrate with a transparent electrode according to any of <1> to <5>, in which the transparent foundation oxide layer is formed from a raw material having the same composition as that of the transparent conductive oxide layer and in which the raw material is indium tin oxide.

<7> The method for producing a substrate with a transparent electrode according to <6>, in which the indium tin oxide is indium oxide added with tin oxide and in which the tin oxide is added in an amount of 8.2% by mass or more and 11.2% by mass or less.

<8> A substrate with a transparent electrode including:
a film base material; and
a transparent oxide layer on the film base material,
the transparent oxide layer including an amorphous transparent foundation oxide layer and an amorphous transparent conductive oxide layer formed sequentially on the film base material, and an interface between the film base material and the transparent foundation oxide layer being approximately flat without unevenness greater than a film thickness of the transparent foundation oxide layer when a cross-section of the substrate with a transparent electrode is observed with a transmission electron microscope.

<9> A substrate with a transparent electrode including:
a film base material; and
a transparent oxide layer on the film base material,
the transparent oxide layer including an amorphous transparent foundation oxide layer and an amorphous transparent conductive oxide layer formed sequentially on the film base material, and an oxygen content as measured by X-ray photoelectron spectroscopy being linearly approximated by a linear function having a slope monotonically decreasing towards the transparent foundation oxide layer and the slope being −1.0 or more and −0.5 or less in a region from an interface between the transparent conductive oxide layer and the transparent foundation oxide layer to a position 10 nm away from the interface towards the transparent conductive oxide layer when viewed in a cross-section of the substrate with a transparent electrode.

<10> The substrate with a transparent electrode according to <8> or <9>, in which the transparent oxide layer has an average grain size (Da), an average value of grain size when observed from a surface opposite to the film base material, of 1.5 times or more and 2.5 times or less the film thickness ($t_T$) of the transparent oxide layer.

Effects of the Invention

The present application is directed to a method for producing a substrate with a transparent electrode having low sheet resistance.

DETAILED DESCRIPTION

Figure 1:
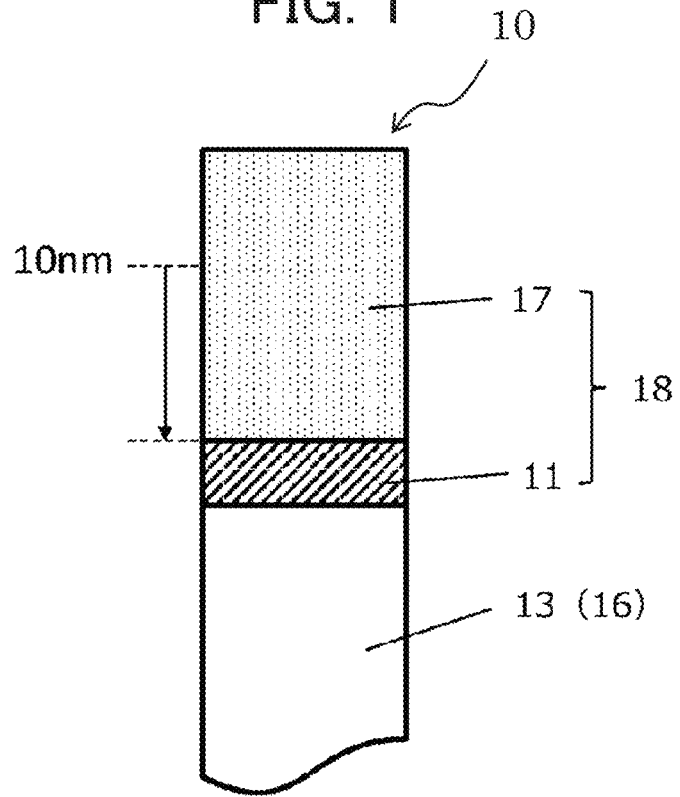
FIG. 1 is a cross-sectional view of a substrate with a transparent electrode as described in the Examples.

An embodiment of the present application will now be described. Furthermore, dimensions of various members in drawings are adjusted for easy viewing, for convenience.
[Configuration of Substrate with Transparent Electrode]
<Substrate with Transparent Electrode>
FIG. 1 is a cross-sectional view showing a substrate with a transparent electrode 10. This substrate with a transparent electrode 10 includes a film base material 16, a transparent foundation oxide layer 11, and a transparent conductive oxide layer 17 in this order. Hereinafter, a combination of the transparent foundation oxide layer 11 and the transparent conductive oxide layer 17 is referred to as a transparent oxide layer 18. The transparent foundation oxide layer 11 may be a single layer or a plurality of layers, but is preferably a single layer from the viewpoints of productivity and achievement of crystallization through an annealing treatment in a short time.

<Film Base Material>
The film base material 16 is a material serving as a base for the substrate with a transparent electrode 10 (basic material: base material). The film base material 16 is preferably a transparent film base material 16 which is colorless and transparent in a visible light region.
(Transparent Film Substrate)
The film base material 16 includes a transparent film substrate 13. The transparent film substrate 13 is not particularly limited as long as it is transparent, colorless and at least transparent in a visible light region. A thickness of the transparent film substrate 13 is not particularly limited, but is preferably 10 µm or more and 400 µm or less and more preferably 20 µm or more and 200 µm or less. When the thickness of the transparent film substrate 13 falls within either of the above-mentioned ranges, the transparent film substrate 13 and in turn the substrate with a transparent electrode 10 ensures sufficient durability and has adequate flexibility.

In addition, when the thickness of the transparent film substrate 13 falls within either of the above-mentioned ranges, the transparent foundation oxide layer 11, the transparent conductive oxide layer 17, and the like can be formed in a roll-to-roll fashion, so that the substrate with a transparent electrode 10 can be produced with high productivity.

The transparent film substrate 13 is preferably one having a molecular structure with a high mechanical property and high heat resistance or having an increased mechanical property such as Young's modulus or increased heat resistance by orientating a molecule in a predetermined direction by biaxial stretching.

Generally, a stretched film exhibits heat-shrinking upon heating due to residual strain in a molecular chain after stretching. Therefore, a biaxially stretched film or low heat-shrinkable film is known that has a percentage of heat shrinkage of about 0.2% or less decreased through relaxation of stress or strain by adjusting stretching conditions or heating after stretching in order to decrease such heat shrinkage, and has an increased heat-shrinkage initiation temperature. In the present application, such a low heat-shrinkable film is preferably used as the transparent film substrate 13 from the viewpoint of suppressing a failure due to heat shrinkage of the transparent film substrate 13 in a production process of the substrate with a transparent electrode 10.

Examples of a material of the transparent film substrate 13 include polyester resins such as polyethylene terephthalate (PET), polybutylene terephthalate (PBT), or polyethylene naphthalate; cycloolefin-based resins; polycarbonate resins; polyimide resins; or cellulose-based resins. Among them, polyester-based resins are preferable and polyethylene terephthalate is more preferable from the viewpoints of low-cost and excellent transparency.

(Functional Layer)

For the film base material 16, a functional layer (not shown) having at least one of, for example, an optical adjustment layer, an anti-reflection layer, an anti-glare layer, an easy adhesion layer, a stress relaxation layer, a hard coat layer, a slippable layer, an antistatic layer, a crystallization promoting layer, a crystallization rate adjusting layer, a coating layer, and the like may be formed on one surface such as a top surface or a bottom surface or both surfaces of the transparent film substrate 13. The functional layer may include a plurality of layers such as a combination of the hard coat layer and the optical adjustment layer.

In particular, the optical adjustment layer can not only suppress reflection of light between the transparent film substrate 13 and transparent foundation oxide layer 11 to thereby increase light transmittance but also adjust a color utilizing interference of light by forming the optical adjustment layer between materials having different refractive indexes, the transparent film substrate 13 (refractive index: 1.4 to 1.7) and the transparent foundation oxide layer 11/the transparent conductive oxide layer 17 (refractive index: 1.9 to 2.2). Such an optical adjustment layer may be a single layer or a plurality of layers, but preferably has an average refractive index represented by Formula 1 below falling between a refractive index of the transparent film substrate 13 or the functional layer such as the hard coat layer and a refractive index of the transparent foundation oxide layer 11 to be used.

[Formula 1]

$$n_{ave} = \frac{\sum_{n=1}^{m}(n_i d_i)}{\sum_{n=1}^{m} d_i} \quad (1)$$

In Formula (1), $n_{ave}$ denotes an average refractive index, $n_i$ denotes a refractive index of each of layers, $d_i$ denotes a physical film thickness of each of layers, and m denotes the number of laminated layers.

Furthermore, for example, when the functional layer is the hard coat layer, the hard coat layer has preferably a thickness of 1 μm or more and 10 μm or less, more preferably 3 μm or more and 8 μm or less, and still more preferably 5 μm or more and 8 μm or less, in order to impart adequate durability and flexibility to the transparent film base material 16. A material of the hard coat layer is not particularly limited, and examples thereof include urethane-based resins and silicone-based resins. One appropriately selected therefrom is applied and cured.

<Transparent Oxide Layer>

The substrate with a transparent electrode 10 of the present application includes the transparent oxide layer 18 on the film base material 16 as shown in FIG. 1. The transparent oxide layer 18 includes an amorphous transparent foundation oxide layer 11 and an amorphous transparent conductive oxide layer 17 ordered sequentially from a film base material 16 side.

The term "amorphous" as used herein, refers to a state in which a crystalline state such as a clear grain is not observed immediately after film formation by transmission electron microscopy (TEM) or a state in which atomic arrangement is disordered even though a granular structure is observed. Meanwhile, the term "crystalline" or alternatively "non-amorphous" means a state in which ordered atomic arrangement can be observed such as lattice image by transmission electron microscopy (TEM) among layers in which a crystalline state such as a grain can be confirmed. In detail, layers having ordered atomic arrangement over a distance of about 5 nm can be said to be crystalline. Crystalline and amorphous can be differentiated from each other based on image contrast when a cross-section thereof is observed by TEM.

(Transparent Foundation Oxide Layer)

The transparent foundation oxide layer 11 serving as a foundation of the transparent conductive oxide layer 17 will now be described. The transparent foundation oxide layer 11 is amorphous. When the transparent foundation oxide layer 11 is amorphous, the transparent foundation oxide layer 11 has a flatter surface. Furthermore, an amorphous transparent foundation oxide layer 11 results in the transparent foundation oxide layer 11 having no grain boundary, and therefore, a crystallization inhibiting component can be suppressed from diffusing from the transparent film base material 16 upon formation of the transparent conductive oxide layer 17. Moreover, crystal size after annealing can be large and uniform since there is no nucleus for crystal growth upon annealing and crystallization occurs simultaneously with the transparent conductive oxide layer 17 upon annealing.

The transparent foundation oxide layer 11 preferably uses a material having the same composition as that of the transparent conductive oxide layer 17 from the viewpoint of increasing an average grain size to a predetermined range.

The transparent foundation oxide layer 11 contains, as a major component, zinc oxide, yttrium oxide, magnesium oxide, or indium oxide. Among them, an amorphous thin film containing, as a major component, indium oxide is preferably formed. The phrase "contains as a major component", as used herein, means the component is contained in an amount of more than 50% by mass.

Moreover, the transparent foundation oxide layer 11 preferably uses a material having the same composition as that of the transparent conductive oxide layer 17, as described above. The phrase "material having the same composition," as used herein, refers to a sputtering target material of which composition is not changed on purpose when formed by sputtering. The above-mentioned sputtering target is preferably indium oxide added with tin oxide, also referred to as "ITO", and tin oxide is preferably added in an amount of 8.2% by mass or more and 11.2% by mass or less, more preferably 8.6% by mass or more and 11.0% by mass or less, and further preferably 9.0% by mass or more and 10.5% by mass or less of the total mass of the composition.

In recent techniques, an amount of addition of tin oxide at which ITO formed on a film substrate has the least resistivity is said to be 8.0% by mass to 8.5% by mass. It is believed that this may be derived from a degree of crystallization of ITO.I In other words, when the amount of addition of tin oxide is increased to about 10% by mass, ITO is insufficiently crystallized even though annealing is performed. Meanwhile, in the present application, ITO is sufficiently crystallized even though a large amount of tin oxide is added, due to an effect of the transparent foundation oxide layer 11.

Furthermore, a film thickness t1 of the transparent foundation oxide layer 11 is preferably 1.5% or more and 3.0% or less relative to a film thickness $t_T$ of the transparent oxide layer 18. A proportion of the film thickness t1 of the transparent foundation oxide layer 11 to the film thickness $t_T$ of the transparent oxide layer 18 preferably falls within the above-mentioned range in order to serve a major purpose of the transparent foundation oxide layer 11, that is, to suppress a carbon- or nitrogen-atom containing component (crystallization inhibiting component) from diffusing from the transparent film base material 16 into the transparent conductive oxide layer 17 or a film-forming chamber even though the transparent foundation oxide layer 11 has higher resistance than that of the transparent conductive oxide layer 17. For example, when the film thickness $t_T$ of the transparent oxide layer 18 is 30 nm to 150 nm, the film thickness t1 of the transparent foundation oxide layer 11 is preferably 0.45 nm or more and 4.50 nm or less, more preferably 0.67 nm or more and 3.75 nm or less, and still more preferably 0.75 nm or more and 3.15 nm or less.

Indium oxide, a major component contained in the transparent foundation oxide layer 11, will now be described. Inclusion of indium oxide, which may be an oxide containing indium as a major component, as a major component in the transparent foundation oxide layer 11 is preferable from the viewpoint of controlling surface free energy of the transparent foundation oxide layer 11 to an optimal value for forming the transparent conductive oxide layer 17. Furthermore, indium oxide is also preferable from the viewpoints of imparting a barrier property for protecting the transparent film base material 16 against not only chemical factors such as water vapor but also physical factors such as plasma. Moreover, indium oxide is also preferable since it includes no carbon atom or nitrogen atom which may be an inhibiting factor for crystallization of the transparent conductive oxide layer 17.

Moreover, the transparent foundation oxide layer 11 according to the present application can suppress the transparent conductive oxide layer 17 from crystallizing at normal temperature, i.e., normal temperature crystallization, compared to known materials for a foundation layer such as silicon oxide. The phrase "normal temperature crystallization", as used herein, refers to a phenomenon in which crystallization does not occur even when subjected to annealing since crystallization progresses differently from upon annealing by standing at atmospheric pressure and normal temperature after the transparent conductive oxide layer 17 is formed. This is believed to result from an effect of the amorphous transparent foundation oxide layer 11 of controlling activation energy when the transparent conductive oxide layer 17 is crystallized.

In particular, the transparent foundation oxide layer 11 formed by a sputtering method using an inorganic compound composed of an oxide containing indium as a major component is more useful, for example, than a foundation layer formed by a sputtering method using silicon which strongly binds to oxygen.

This is because since silicon binds more strongly to oxygen than indium, silicon easily tends to become an oxygen-supersaturated film (layer) upon film formation through sputtering. This tendency excessively promotes crystallization of the transparent conductive oxide layer 17 formed on the oxygen-supersaturated layer, potentially leading to progress of normal temperature crystallization. However, in the case of forming a film by sputtering indium oxide, such a problem does not occur. Furthermore, compounds containing indium oxide as a major component are preferably used as the transparent oxide layer 18 from the viewpoint of lattice matching between the transparent foundation oxide layer 11 and the transparent conductive oxide layer 17. Based on the above, the transparent foundation oxide layer 11 is preferably substantially free of silicon oxide. The phrase "substantially free of" means that a substance is contained in an amount of less than 1% by mass, preferably less than 0.1% by mass, and particularly preferably 0% by mass.

(Transparent Conductive Oxide Layer)

The transparent conductive oxide layer 17 will now be described. The transparent conductive oxide layer 17 is amorphous before a crystallization step by annealing. As mentioned above, the transparent conductive oxide layer 17 is preferably made of a material having the same composition as that of the transparent foundation oxide layer 11. In this case, the transparent conductive oxide layer 17 is preferably formed as an amorphous thin film containing, as a major component, zinc oxide, yttrium oxide, magnesium oxide, or indium oxide, in particular, indium oxide, as with the transparent foundation oxide layer 11. Indium oxide added with tin oxide (ITO) is more preferably used.

In the case where ITO is used as the transparent conductive oxide layer 17, tin oxide is added to a sputtering target in an amount of preferably 8.2% by mass or more and 11.2% by mass or less, more preferably 8.6% by mass or more and 11.0% by mass or less, and still further preferably 9.0% by mass or more and 10.5% by mass or less. Such ranges of the amount make it easy for a carrier density of the transparent conductive oxide layer 17 to fall within a suitable range of $2\times10^{20}$ cm$^{-3}$ or more and $9\times10^{20}$ cm$^{-3}$ or less and a more suitable range of $6\times10^{20}$ cm$^{-3}$ or more and $8\times10^{20}$ cm$^{-3}$ or less.

Such ranges of the carrier density make it easy for resistivity of a crystalline transparent oxide layer 18 after annealing to decrease to $2.8\times10^{-4}$ Ωcm or less. Such a low-resistance transparent oxide layer 18 contributes to, for example, an increase in a response speed of electrostatic capacitance touch panels, improvement in uniformity of in-plane brightness of organic electroluminescent lighting, or saving of power consumption of various optical devices.

A film thickness t2 of the transparent conductive oxide layer 17 is preferably 97.0% or more and 98.5% or less relative to the film thickness $t_T$ of the transparent oxide layer 18. When the film thickness t2 of the transparent conductive oxide layer 17 falls within the above-mentioned range, the low-resistance transparent oxide layer 18 can be obtained after annealing while suppressing the crystallization inhibiting component from diffusing from the transparent film base material 16 to the transparent conductive oxide layer 17 or the film-forming chamber by the action of the transparent foundation oxide layer 11.

The film thickness $t_T$ of the transparent oxide layer 18 is preferably 30 nm or more and 150 nm or less, more preferably 45 nm or more and 125 nm or less, still more preferably 50 nm or more and 105 nm or less from the viewpoints of low resistance and high light transmittance.

Therefore, the film thickness t2 of the transparent conductive oxide layer 17 is preferably 29.1 nm or more and 147.8 nm or less, more preferably 43.6 nm or more and 123.1 nm or less, further preferably 48.5 nm or more and 103.4 nm or less. Such ranges of the film thickness t2 of the transparent conductive oxide layer 17 allow crystallization of the transparent oxide layer 18 through annealing to be surely completed in a short time.

The reason why the crystallization time is thus shortened is unknown, but it is guessed that when the film thickness t2 of the transparent conductive oxide layer 17 falls within the above-mentioned ranges, each layer is structurally changed so as to be easily crystallized by an influence of a plasma process (radiation heat) in sputtering.

Furthermore, the transparent oxide layer 18 has preferably a degree of crystallinity of 85% or more and more preferably 95% or more after the transparent oxide layer 18 is crystallized through annealing. Such ranges of the degree of crystallinity of the transparent oxide layer 18 can decrease light absorbed by the transparent conductive oxide layer 17 and suppress a change in resistance due to an environmental change and the like. Such a degree of crystallinity of the transparent oxide layer 18 is determined from the ratio of an area that grains occupy in an observation field upon microscopy.

[Method for Producing Substrate with Transparent Electrode]

<Base Material Preparation Step>

A method for producing the substrate with a transparent electrode 10 will be described. First, the film base material 16 is prepared. The film base material 16 may be composed of the transparent film substrate 13 alone or composed as the film base material 16 in which a functional layer (not shown) is laminated onto the transparent film substrate 13.

<Film Formation Step>

The transparent foundation oxide layer 11 and the transparent conductive oxide layer 17 are sequentially formed on the film base material 16 so as to contact with the film base material 16. The transparent foundation oxide layer 11 and the transparent conductive oxide layer 17 are successively formed by a sputtering method such as sputtering film formation from the viewpoint of productivity. Among sputtering methods, a magnetron sputtering method is preferably used.

For formation of the transparent foundation oxide layer 11, a magnet intensity in the magnetron sputtering method is preferably in a range of 700 gausses or more and 1300 gausses or less. When the magnet intensity falls within the above-mentioned range, a decrease in use efficiency of the sputtering target is suppressed due to extreme erosion and the transparent foundation oxide layer 11 with good quality is formed. This is believed to result from a decrease in a discharge voltage due to increased magnetic field strength. It is believed that this allows the transparent foundation oxide layer 11 to be formed without heavy damage to the film base material 16. In other words, an interface between the film base material 16 and the transparent foundation oxide layer 11 can be approximately flat as shown in FIG. 4.

Figure 4:
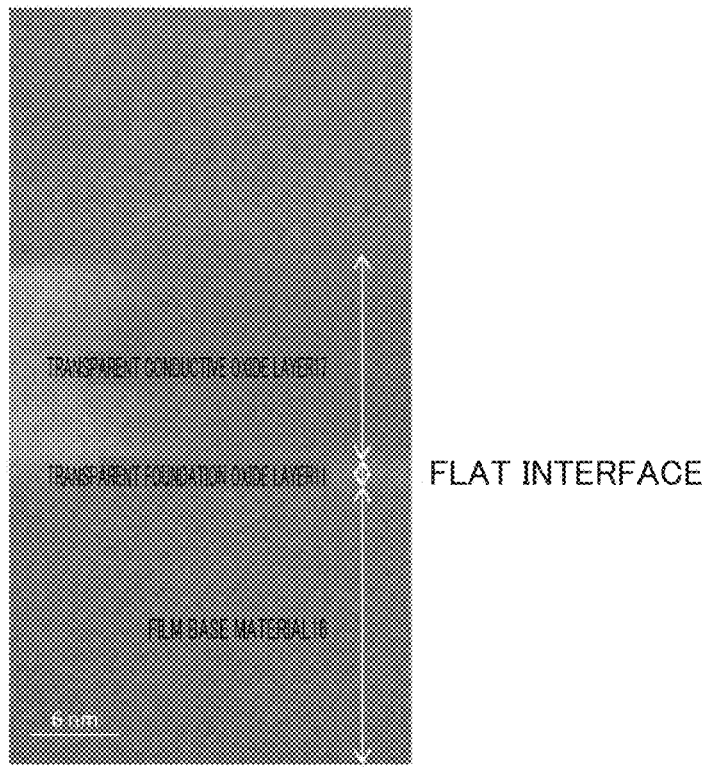
FIG. 4 is a cross-sectional TEM photograph of a substrate with a transparent electrode according to Example 1.

The phrase "approximately flat", as used herein, means that unevenness greater than a film thickness of the transparent foundation oxide layer 11 is not observed when observed with TEM, as shown in FIG. 4. A power supply to be used for sputtering is not limited and a DC power supply, an alternating-current (AC) power supply, or the like is selected depending on a target material.

The transparent foundation oxide layer 11 is formed on the transparent film base material 16 or the functional layer. Therefore, the transparent foundation oxide layer 11 is preferably formed so as to reduce damage to a lower layer than the transparent foundation oxide layer 11 and in turn the substrate with a transparent electrode 10. Such a low-damage layer is formed, for example, with a strong magnetic field cathode at a low voltage as mentioned above or at a film-forming pressure that is not too low.

The transparent conductive oxide layer 17 is successively formed on the transparent foundation oxide layer 11 by the sputtering method in a similar manner for the transparent foundation oxide layer 11. The transparent conductive oxide layer 17 is preferably formed by the magnetron sputtering method in a similar manner for the transparent foundation oxide layer 11.

The sputtering film formation is performed while a carrier gas including an inert gas such as argon or nitrogen and/or an oxygen gas is introduced into the film-forming chamber. In this case, argon is preferably used as the inert gas. In the case of using a mixed gas, a mixed gas of argon and oxygen is preferably used. When the mixed gas is used, argon and oxygen may be adjusted to a predetermined mix ratio in advance or may be mixed after a flow rate of each of the gases is controlled by a flow rate controlling device such as a mass flow controller. Furthermore, the mixed gas may include other gases as long as a function of each layer is not impaired.

When the transparent foundation oxide layer 11 is formed, an amount of oxygen to be introduced into the film-forming chamber is important. This is because, when a sputtering target composed of an oxide is used, oxygen derived from the target is introduced into the film even when discharged with an argon gas alone. Furthermore, when oxygen is excessively supplied upon film formation, crystallization of the film is promoted from the time of film formation. Therefore, it is preferred that oxygen is not introduced as the gas when the transparent foundation oxide layer 11 is formed. In other words, an oxygen partial pressure when the transparent foundation oxide layer 11 is formed is preferably 0 to $1.0 \times 10^{-3}$ Pa and more preferably 0 to $5.0 \times 10^{-4}$ Pa.

Meanwhile, when the transparent conductive oxide layer 17 is formed, a mixed gas of oxygen and an inert gas is preferably used and the mixed gas preferably includes argon and oxygen. An oxygen partial pressure when the transparent conductive oxide layer 17 is formed is higher than the oxygen partial pressure when the transparent foundation oxide layer 11 is formed in order for the transparent conductive oxide layer 17 to be amorphous. In this case, the oxygen partial pressure when the transparent conductive oxide layer 17 is formed is, for example, preferably $1.0 \times 10^{-3}$ Pa or more and $5.0 \times 10^{-2}$ Pa or less and more preferably $3.0 \times 10^{-3}$ Pa or more and $4.0 \times 10^{-2}$ Pa or less. In such a state in which oxygen is supplied in a relatively low amount, oxygen is greatly deficient and a conductive carrier is produced in a larger amount in an amorphous film after film formation.

When the transparent conductive oxide layer 17 is formed through sputtering, an atmosphere in a vacuum device includes a component with m (mass)/z (charge)=18 having a partial pressure of $2.8 \times 10^{-4}$ Pa or less as measured by a quadrupole mass spectrometer and a component with m/z=28 having a partial pressure of $7.0 \times 10^{-4}$ Pa or less.

The component with m/z=18 is mainly water and the component with m/z=28 is mainly an organic-derived component or nitrogen. When these partial pressures satisfy the above-mentioned relationship, a crystallization inhibiting substance is suppressed from contaminating the transparent oxide layer 18.

Such an atmosphere is generally produced by a method in which a film roll is degassed in a sputtering device or before charging into the device. For example, water is removed through heating, i.e., thermal dehydration. In addition, when the transparent foundation oxide layer 11 is formed under the transparent conductive oxide layer 17, the above-mentioned component is suppressed from diffusing from the transparent film base material 16 upon formation of the transparent conductive oxide layer 17 and also after film formation. Furthermore, the thermal dehydration may be performed in a separate chamber from the film-forming chamber and thus a dehydration step at a high temperature can successively proceed to a film formation step at a low temperature.

Furthermore, pressure (total pressure) within the film-forming chamber is preferably 0.10 Pa or more and 1.00 Pa or less and more preferably 0.15 Pa or more and 0.80 Pa or less.

Moreover, in the present application, a ratio (Pu/Pc) of a film-forming pressure Pu, pressure within the film-forming chamber upon formation of the transparent foundation oxide layer 11, to a film-forming pressure Pc, pressure within the film-forming chamber upon formation of the transparent conductive oxide layer 17 preferably satisfies a relationship represented by Formula (2) below:

[Formula 2]

$$1.0 \leq \frac{P_u}{P_c} \leq 2.5 \quad (2)$$

The film-forming pressure satisfying the relationship represented by Formula (2) above can decrease damage to the transparent film base material 16 due to sputtering and form an amorphous film (layer) with good quality when the transparent foundation oxide layer 11 is formed, and form an amorphous film (layer) with good quality as the transparent conductive oxide layer 17. Among them, the film-forming pressure preferably satisfies 1.0≤Pu/Pc≤2.0 and particularly preferably 1.1≤Pu/Pc≤1.5.

In the present application, when the transparent foundation oxide layer 11 is formed through sputtering film formation, a discharge voltage is −280 V or more and −255 V or less. I In other words, an absolute value of the discharge voltage satisfies 255 V or more and 280 V or less.

In addition, Formula (3) below is preferably satisfied in which $V_U$ denotes a discharge voltage upon formation of the transparent foundation oxide layer 11 and $V_C$ denotes a discharge voltage upon formation of the transparent conductive oxide layer 17.

[Formula 3]

$$0.86 \leq \frac{V_U}{V_C} \leq 0.98 \quad (3)$$

The voltage satisfying the relationship represented by Formula (3) above can decrease damage to the transparent film base material 16 due to sputtering and form an amorphous film (layer) with good quality when the transparent foundation oxide layer 11 is formed, and form an amorphous film (layer) with good quality as the transparent conductive oxide layer 17. Among them, the voltage more preferably satisfies 0.90≤$V_U$/$V_C$≤0.98.

The transparent oxide layer 18 may be formed by sputtering through one successive film formation, but preferably through repeating film formation multiple times from the viewpoints of a production processing speed or heat history of the transparent film base material 16.

A temperature of the substrate during the sputtering film formation may be any temperature in a range in which the transparent film base material 16 is heat resistant, and is preferably 60° C. or less and more preferably −20° C. or more and 40° C. or less. Such a temperature of the substrate makes it difficult for water or an organic substance, e.g., oligomeric component, to volatilize from the transparent film base material 16 and makes it easy for indium oxide to crystallize. Furthermore, when the temperature is higher than the above-mentioned range, the transparent foundation oxide layer 11 and the transparent conductive oxide layer 17 tend to be crystalline from the time of film formation and therefore the transparent oxide layer 18 having low resistivity, the object of the present application, is difficult to form.

In addition, after an amorphous transparent oxide layer 18 is crystallized in a subsequent crystallization step through annealing, that is, when a crystallized transparent oxide layer or crystalline transparent oxide layer 18 is formed, a crystal defect can be suppressed from being produced, as a result, increase in resistivity of the transparent oxide layer 18 is suppressed.

Furthermore, the temperature of the substrate falling within the above-mentioned range suppresses light transmittance of the transparent oxide layer 18 from decreasing or the transparent film base material 16 from embrittling. In addition, the transparent film base material 16 is not greatly changed in size during a film formation step.

Furthermore, in the film formation step, the transparent foundation oxide layer 11 and the transparent conductive oxide layer 17 are preferably formed by a roll-to-roll method using a winding sputtering device. The film formation by the roll-to-roll method results in a continuous sheet wound in a roll shape of the transparent film base material 16 on which outermost surface of the amorphous transparent conductive oxide layer 17 is laminated. The winding sputtering device allows the transparent foundation oxide layer 11 and the transparent conductive oxide layer 17 to be continuously formed with high efficiency.

<Crystallization Step>

After the above steps, the substrate with a transparent electrode 10 is produced. This substrate with a transparent electrode 10 can be crystallized through, for example, annealing at any time by a user. After the crystallization step, a low-resistance transparent oxide layer 18 is obtained through crystallization of the transparent foundation oxide layer 11 and the transparent conductive oxide layer 17.

In detail, the substrate with a transparent electrode 10 on which the amorphous transparent oxide layer 18 is formed can be crystallized by, for example, subjecting to annealing at a temperature of 120° C. or more and 170° C. or less. In this crystallization step, the annealing is preferably performed under an oxygen-containing atmosphere such as air in order for oxygen to be incorporated sufficiently in the transparent oxide layer 18 to thereby shorten a crystallization time. This is because the crystallization progresses even in a vacuum or under an inert gas atmosphere, but crystallization tends to take a longer time to crystallize under such an oxygen-free atmosphere than under the oxygen-containing atmosphere.

Figure 2:
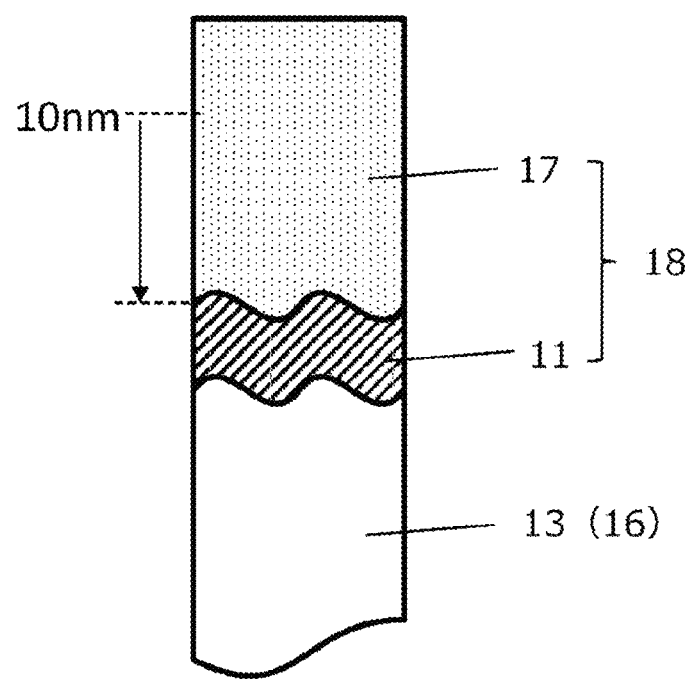
FIG. 2 is a cross-sectional view of a substrate with a transparent electrode as described in the Comparative Examples.
Figure 3:
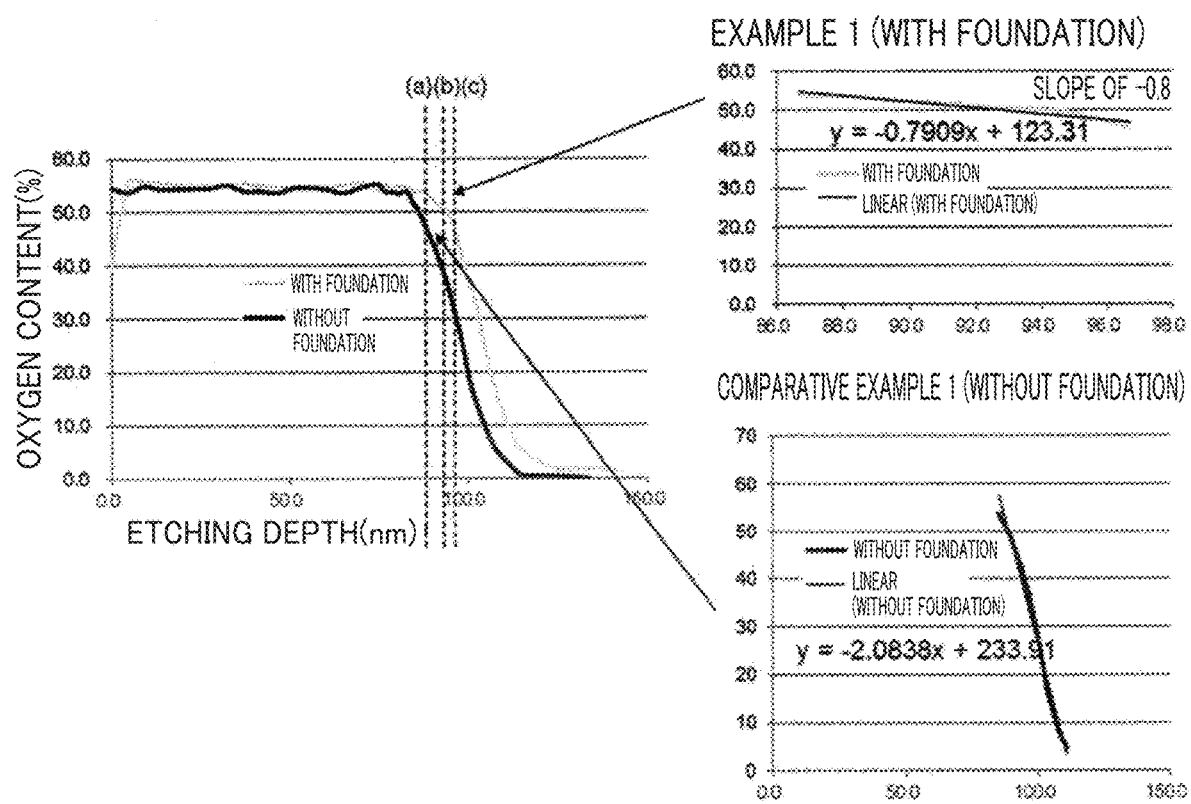
FIG. 3 is a graph showing a relationship between an etching depth and an oxygen content in a substrate with a transparent electrode with a transparent foundation oxide layer according to Example 1 and a substrate with a transparent electrode without a transparent foundation oxide layer according to Comparative Example 1.

For a physical property before crystallization, in the present application, when a composition of the transparent oxide layer 18 in a film thickness direction is measured by X-ray photoelectron spectroscopy (XPS), an oxygen content is monotonically decreasing towards the transparent foundation oxide layer 11 in a region (see FIGS. 1 and 2) from an interface between the transparent conductive oxide layer 17 and the transparent foundation oxide layer 11 to a position 10 nm away from the interface towards the transparent conductive oxide layer 17 as viewed in a cross-section of the substrate with a transparent electrode. The decreasing is linearly approximated by a linear function, the linear function preferably has a slope of −1.0 or more and −0.5 or less and more preferably −1.0 or more and −0.7 or less when a direction from a surface of the transparent oxide layer 18 to the transparent film base material 16 is determined as a x-axis positive direction and a direction in which an amount detected by XPS is increasing is determined as a y-axis positive direction in the film thickness direction (see FIG. 3). FIG. 3 shows the slopes of the linear functions of the substrates with transparent electrodes 10 of Example 1 and Comparative Example 1. Furthermore, in FIG. 3, (a) represents a position 10 nm away from the interface between the transparent conductive oxide layer 17 and the transparent foundation oxide layer 11 towards the transparent conductive oxide layer 17, (b) represents a position of the interface between the transparent conductive oxide layer 17 and the transparent foundation oxide layer 11, and (c) represents a position of an interface between the transparent film base material 16 and the transparent foundation oxide layer 11.

For example, when the transparent conductive oxide layer 17 is formed directly on the transparent film base material 16 without the transparent foundation oxide layer 11, the slope of the linear function is increased as described in Comparative Example 1. It is believed that this is because a polymeric compound or organic compound component of the transparent film base material 16 excessively acquires oxygen from the transparent conductive oxide layer 17. As a result, the transparent conductive oxide layer 17 in the vicinity of an interface between the transparent conductive oxide layer 17 and the transparent film base material 16 is believed to have a decreased function as a conductive layer (higher resistance).

For a physical property after crystallization, in the present application, an average grain size Da, an average value of grain size when observed from a surface of the transparent oxide layer 18, is preferably 1.5 times or more and 2.5 times or less the film thickness $t_T$ of the transparent oxide layer 18. Among them, the Da is more preferably 1.5 times or more and 1.9 times or less. The average grain size falling within these ranges allows the grain size to be uniform in all plane directions of the transparent oxide layer 18. When there is a grain having an extremely large size, a grain having a small size may be produced, conversely. Such non-uniformity in grain size blocks electron transport, making it difficult to decrease resistivity. One major cause of such blockage of the electron transport is believed to be an act of a potential barrier produced in a grain boundary.

As mentioned above, when the film thickness $t_T$ of the transparent oxide layer 18 is 30 nm or more and 150 nm or less, the average grain size Da of crystals included in the transparent oxide layer 18 is preferably 45 nm or more and 375 nm or less and more preferably 45 nm or more and 285 nm or less.

Furthermore, when the substrate with a transparent electrode 10 is crystallized as a continuous sheet wound in a roll shape, the substrate is crystallized while the film remains wound or while the film is conveyed in a roll-to-roll fashion. Furthermore, the film, that is, the substrate with a transparent electrode 10 may be cut into a predetermined size and then crystallized.

When the substrate is crystallized while the film remains wound, the transparent film base material 16 on which the transparent oxide layer 18 is formed may continue to be left in a normal temperature and normal pressure environment or may be aged (left to stand) in, for example, a heating chamber. When the substrate is crystallized in the roll-to-roll fashion, the transparent film base material 16 is introduced in a heating furnace while being conveyed, heated, and then wound into a roll again. When the substrate is crystallized at room temperature, the roll-to-roll method may also be employed for the purpose of, for example, promoting the crystallization by bringing the transparent oxide layer 18 into contact with oxygen.

[Application of Substrate with a Transparent Electrode]

The thus-produced substrate with a transparent electrode 10 is used as a transparent electrode for display devices such as touch panels, displays, or digital signages; smart windows such as light-control films, and the like.

A conductive member produced by applying a conductive ink or a conductive paste on the substrate with a transparent electrode 10 and heating results in a collecting electrode as a routing wiring for a circuit. The heating is not particularly limited and examples thereof include heating by an oven, an infrared (IR) heater, or the like. Furthermore, a temperature or a period of the heating is appropriately set in view of a temperature or a period at or for which the conductive member adheres to the transparent oxide layer 18. In the case of using the oven, the heating may be performed, for example, at a temperature in a range of 120° C. or more and 150° C. or less for 30 minutes or more and 60 minutes or less, and in the case of using the IR heater, the heating may be performed, for example, at about 150° C. for about 5 minutes.

A method for forming the routing wiring for a circuit is not limited to a method in which a conductive ink or a conductive paste is applied on the substrate with a transparent electrode 10 and heated. For example, the routing wiring for a circuit may also be formed by a dry-coating method or a photolithographic method. In particular, when the routing wiring for a circuit is formed by the photolithographic method, the wiring is relatively easily thinned.

EXAMPLES

The present application will now be more specifically described by way of Examples, but the present application is not limited to these Examples.

<Measurement of Film Thickness>

A film thickness of each of the transparent foundation oxide layer 11 and the transparent conductive oxide layer 17 was a value determined by observing a cross-section of the substrate with a transparent electrode 10 with a transmission electron microscope (TEM).

<Measurement of Resistance>

Sheet resistance of the transparent oxide layer 18 was measured by four-probe pressure welding measurement using a low-resistivity meter LORESTA-GP (MCP-T710, manufactured by Mitsubishi Chemical Corporation). Furthermore, resistivity of the transparent foundation oxide layer 11 was calculated from a measurement result of surface resistance of the transparent foundation oxide layer 11 which had been separately formed alone.

<Evaluation of Transparent Foundation Oxide Layer>

The transparent foundation oxide layer 11 was separately formed alone and resistivity was calculated from a result of measurement of surface resistance thereof. Furthermore, an atomic force microscope (AFM) (NANONAVI II, manufactured by SII) was used to measure geometry in one micrometer around to thereby confirm the presence or absence of grain based on the geometry, and the TEM, which was the same as in the film thickness measurement, was used to observe a lattice image to thereby confirm the presence or absence over a short distance of order of 5 nm or more.

<Crystallization Step and Evaluation of Crystallinity>

The substrate with a transparent electrode 10 was annealed at 150° C. for 1 hour. The TEM, which was the same as in the film thickness measurement, was used to confirm crystallinity of the transparent oxide layer 18 which had been annealed. As a result, the transparent oxide layer 18 was observed to be completely crystallized (degree of crystallization of the transparent oxide layer: 100%).

<Normal Temperature Crystallization and Evaluation of Crystallinity>

The substrate with a transparent electrode 10 which had not been annealed was left to stand under an environment at 25° C./50% RH for 1 week and at this time the transparent oxide layer 18 was evaluated by measuring sheet resistance thereof. Decreased sheet resistance was determined as equivalent to progressed crystallization.

Example 1

For formation of the transparent foundation oxide layer 11 and the transparent conductive oxide layer 17, the transparent foundation oxide layer 11 and the transparent conductive oxide layer 17 were successively formed by a magnetron sputtering method using indium/tin oxide (tin oxide content: 10% by weight) as a target. For formation of the transparent foundation oxide layer 11, a magnet intensity in the magnetron sputtering method was set to a range of 700 gausses or more and 1300 gausses or less at the strongest magnetic field strength on a surface of the target. Furthermore, a temperature of a substrate in each film formation was set to 20° C. and the film was formed while a mixed gas of oxygen and argon was introduced into a device.

For formation of the transparent foundation oxide layer 11, argon and oxygen were supplied at a ratio of 100:0 by volume, and total pressure in a film-forming chamber, a power density, and a film thickness t1 were set to 0.33 Pa, 0.5 W/cm$^2$ (discharge voltage: −268 V), and 3.0 nm, respectively. Resistivity of the transparent foundation oxide layer 11 was $5.0×10^{-3}$ Ωcm.

For formation of the transparent conductive oxide layer 17, argon and oxygen were supplied at a ratio of 100:5 by volume, and oxygen partial pressure, total pressure in a film-forming chamber, a power density, and a film thickness t2 were set to 0.013 Pa, 0.28 Pa, 2.5 W/cm$^2$ (discharge voltage: −285 V), and 97.0 nm, respectively. As a result, a total film thickness $t_T$ of the film thickness t1 of the transparent foundation oxide layer 11 and the film thickness t2 of the transparent conductive oxide layer 17 was 100.0 nm.

Sheet resistance of the transparent oxide layer 18 was 61Ω/□ after film formation (R0), 20.1Ω/□ after annealing (R1), and 56Ω/□ after normal temperature crystallization (R2). As a result, a difference between the sheet resistance after film formation (R0) and the sheet resistance after normal temperature crystallization (R2) (R0−R2) was 5 Ω/□.

When an interface between the transparent film base material 16 and the transparent foundation oxide layer 11 was observed with TEM, unevenness, which was assumed as damage to the transparent film base material 16, was not observed in the vicinity of the interface and the interface was approximately flat as shown in FIG. 4.

An amount of oxygen in the vicinity of an interface between the transparent conductive oxide layer 17 and the transparent foundation oxide layer 11 was analyzed from XPS analysis before annealing and, as a result, a slope of the linear function was −0.8. A grain size of the transparent oxide layer 18 after annealing was observed with AFM and, as a result, an average grain size Da was 180 nm.

Example 2

For formation of the transparent foundation oxide layer 11 and the transparent conductive oxide layer 17, indium/tin oxide (tin oxide content: 10% by weight) was used as a target. Furthermore, a temperature of a substrate in each film formation was set to 20° C. and the film was formed while a mixed gas of oxygen and argon was introduced into a device.

For formation of the transparent foundation oxide layer 11, argon and oxygen were supplied at a ratio of 100:0 by volume, and total pressure in a film-forming chamber, a power density, and a film thickness t1 were set to 0.33 Pa, 0.5 W/cm$^2$ (discharge voltage: −268 V), and 2.0 nm, respectively. Resistivity of the transparent foundation oxide layer 11 was $5.0×10^{-3}$ Ωcm.

For formation of the transparent conductive oxide layer 17, argon and oxygen were supplied at a ratio of 100:5 by volume, and oxygen partial pressure, total pressure in a film-forming chamber, a power density, and a film thickness t2 were set to 0.013 Pa, 0.28 Pa, 2.5 W/cm$^2$ (discharge voltage: −285 V), and 97.0 nm, respectively. As a result, a total film thickness $t_T$ of the film thickness t1 of the transparent foundation oxide layer 11 and the film thickness t2 of the transparent conductive oxide layer 17 was 99.0 nm.

Sheet resistance was 67Ω/□ after film formation (R0), 20.3Ω/□ after annealing (R1), and 61Ω/□ after normal temperature crystallization (R2). As a result, a difference between the sheet resistance after film formation (R0) and the sheet resistance after normal temperature crystallization (R2) (R0−R2) was 6 Ω/□.

When an interface between the transparent film base material 16 and the transparent foundation oxide layer 11 was observed with TEM, unevenness, which was assumed as damage to the transparent film base material 16, was not observed in the vicinity of the interface and the interface was approximately flat.

An amount of oxygen in the vicinity of an interface between the transparent conductive oxide layer 17 and the transparent foundation oxide layer 11 was analyzed from XPS analysis before annealing and, as a result, a slope of the linear function was −0.9. A grain size of the transparent oxide layer 18 after annealing was observed with AFM and, as a result, an average grain size Da was 160 nm.

Example 3

For formation of the transparent foundation oxide layer 11 and the transparent conductive oxide layer 17, indium/tin oxide (tin oxide content: 10% by weight) was used as a target. Furthermore, a temperature of a substrate in each film formation was set to 20° C. and the film was formed while a mixed gas of oxygen and argon was introduced into a device.

For formation of the transparent foundation oxide layer 11, argon and oxygen were supplied at a ratio of 100:0 by volume, and total pressure in a film-forming chamber, a power density, and a film thickness t1 were set to 0.35 Pa, 0.5 W/cm$^2$ (discharge voltage: −268 V), and 3.0 nm, respectively. Resistivity of the transparent foundation oxide layer 11 was $5.0×10^{-3}$ Ωcm.

For formation of the transparent conductive oxide layer 17, argon and oxygen were supplied at a ratio of 100:8 by volume, and oxygen partial pressure, total pressure in a film-forming chamber, a power density, and a film thickness t2 were set to 0.015 Pa, 0.20 Pa, 2.5 W/cm$^2$ (discharge voltage: −285 V), and 97.0 nm, respectively. As a result, a total film thickness $t_T$ of the film thickness t1 of the transparent foundation oxide layer 11 and the film thickness t2 of the transparent conductive oxide layer 17 was 100.0 nm.

Sheet resistance was 72Ω/□ after film formation (R0), 19.9Ω/□ after annealing (R1), and 60Ω/□ after normal temperature crystallization (R2). As a result, a difference between the sheet resistance after film formation (R0) and the sheet resistance after normal temperature crystallization (R2) (R0–R2) was 12 Ω/□.

When an interface between the transparent film base material 16 and the transparent foundation oxide layer 11 was observed with TEM, unevenness, which was assumed as damage to the transparent film base material 16, was not observed in the vicinity of the interface and the interface was approximately flat.

An amount of oxygen in the vicinity of an interface between the transparent conductive oxide layer 17 and the transparent foundation oxide layer 11 was analyzed from XPS analysis before annealing and, as a result, a slope of the linear function was −0.6. A grain size of the transparent oxide layer 18 after annealing was observed with AFM and, as a result, an average grain size Da was 200 nm.

Example 4

For formation of the transparent foundation oxide layer 11 and the transparent conductive oxide layer 17, indium/tin oxide (tin oxide content: 10% by weight) was used as a target. Furthermore, a temperature of a substrate in each film formation was set to 20° C. and the film was formed while a mixed gas of oxygen and argon was introduced into a device.

For formation of the transparent foundation oxide layer 11, argon and oxygen were supplied at a ratio of 100:0 by volume, and total pressure in a film-forming chamber, a power density, and a film thickness t1 were set to 0.33 Pa, 0.5 W/cm$^2$ (discharge voltage: −268 V), and 3.0 nm, respectively. Resistivity of the transparent foundation oxide layer 11 was $5.0 \times 10^{-3}$ Ωcm.

For formation of the transparent conductive oxide layer 17, argon and oxygen were supplied at a ratio of 100:5 by volume, and oxygen partial pressure, total pressure in a film-forming chamber, a power density, and a film thickness t2 were set to 0.015 Pa, 0.31 Pa, 2.5 W/cm$^2$ (discharge voltage: −285 V), and 97.0 nm, respectively. As a result, a total film thickness $t_T$ of the film thickness t1 of the transparent foundation oxide layer 11 and the film thickness t2 of the transparent conductive oxide layer 17 was 100.0 nm.

Sheet resistance was 66Ω/□ after film formation (R0), 20.1Ω/□ after annealing (R1), and 61Ω/□ after normal temperature crystallization (R2). As a result, a difference between the sheet resistance after film formation (R0) and the sheet resistance after normal temperature crystallization (R2) (R0–R2) was 5 Ω/□.

When an interface between the transparent film base material 16 and the transparent foundation oxide layer 11 was observed with TEM, unevenness, which was assumed as damage to the transparent film base material 16, was not observed in the vicinity of the interface and the interface was approximately flat.

An amount of oxygen in the vicinity of an interface between the transparent conductive oxide layer 17 and the transparent foundation oxide layer 11 was analyzed from XPS analysis before annealing and, as a result, a slope of the linear function was −0.8. A grain size of the transparent oxide layer 18 after annealing was observed with AFM and, as a result, an average grain size Da was 180 nm.

Comparative Example 1

In Comparative Example 1, the transparent conductive oxide layer 17 was disposed directly on the transparent film base material 16 without the transparent foundation oxide layer 11. For formation of the transparent conductive oxide layer 17, argon and oxygen were supplied at a ratio of 100:5 by volume, and oxygen partial pressure, total pressure in a film-forming chamber, a power density, and a film thickness t2 were set to 0.015 Pa, 0.31 Pa, 2.5 W/cm$^2$ (discharge voltage: −285 V), and 100.0 nm, respectively. Furthermore, a temperature of a substrate in film formation was set to 20° C. and the film was formed while a mixed gas of oxygen and argon was introduced into a device.

Sheet resistance was 92Ω/□ after film formation (R0), 34.2Ω/□ after annealing (R1), and 70Ω/□ after normal temperature crystallization (R2). As a result, a difference between the sheet resistance after film formation (R0) and the sheet resistance after normal temperature crystallization (R2) was 22 Ω/□.

When an interface between the transparent film base material 16 and the transparent conductive oxide layer 17 was observed with TEM, unevenness, which was assumed as damage to the transparent film base material 16, was observed in the vicinity of the interface and the transparent film base material 16 and the transparent conductive oxide layer 17 were indented into each other at the interface.

An amount of oxygen in the vicinity of the interface between the transparent conductive oxide layer 17 and the transparent film base material 16 was analyzed from XPS analysis before annealing and, as a result, a slope of the linear function was −2.1. A grain size of the transparent oxide layer 18 after annealing was observed with AFM and, as a result, an average grain size Da was 90 nm.

Comparative Example 2

In Comparative Example 2, silicon oxide was used as the transparent foundation oxide layer 11. For formation of the transparent foundation oxide layer 11, oxygen was controlled to be variably supplied to argon to give a discharge voltage of 450 V in a dual cathode on which a silicon p-doped target is disposed, and total pressure in a film-forming chamber, a power density, and a film thickness t1 were set to 0.33 Pa, 1.0 W/cm$^2$, and 3.0 nm, respectively. Furthermore, a temperature of a substrate in film formation was set to 20° C. and the film was formed while a mixed gas of oxygen and argon was introduced into a device.

For formation of the transparent conductive oxide layer 17, argon and oxygen were supplied at a ratio of 100:5 by volume, and oxygen partial pressure, total pressure in a film-forming chamber, a power density, and a film thickness t2 were set to 0.015 Pa, 0.31 Pa, 2.5 W/cm$^2$ (discharge voltage: −285 V), and 100.0 nm, respectively. As a result, a total film thickness $t_T$ of the film thickness t1 of the transparent foundation oxide layer 11 and the film thickness t2 of the transparent conductive oxide layer 17 was 103.0 nm.

Sheet resistance was 109Ω/□ after film formation (R0), 36.7Ω/□ after annealing (R1), and 52Ω/□ after normal temperature crystallization (R2). As a result, a difference between the sheet resistance after film formation (R0) and the sheet resistance after normal temperature crystallization (R2) (R0–R2) was 57 Ω/□.

Figure 5:
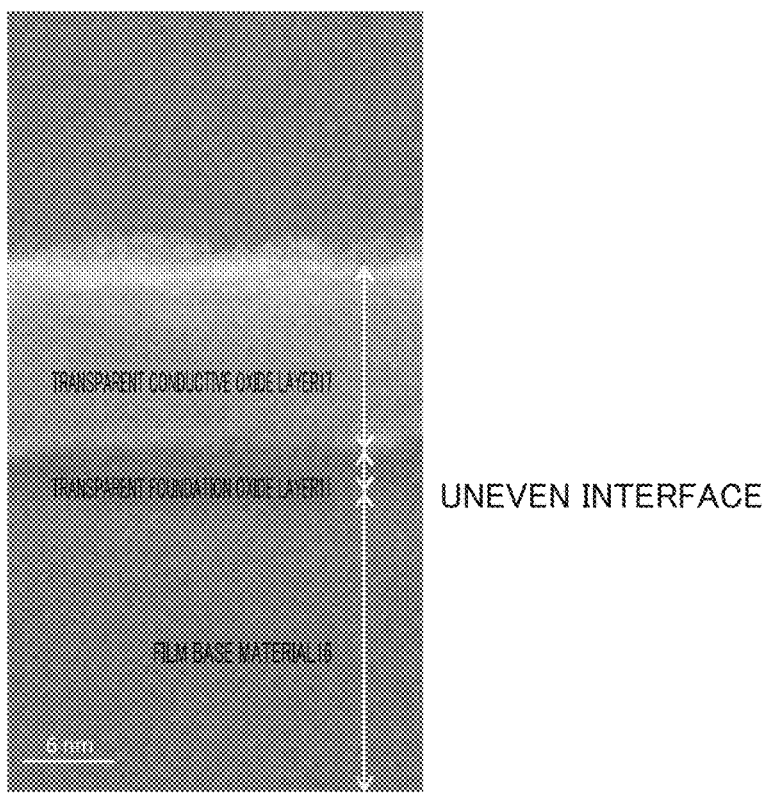
FIG. 5 is a cross-sectional TEM photograph of a substrate with a transparent electrode according to Comparative Example 2.

When an interface between the transparent film base material 16 and the transparent foundation oxide layer 11 was observed with TEM, unevenness, which was assumed as damage to the transparent film base material 16, was observed in the vicinity of the interface, the transparent film base material 16 and the transparent foundation oxide layer 11 were indented into each other at the interface, and the transparent foundation oxide layer 11 had unevenness, as shown in FIG. 5.

An amount of oxygen in the vicinity of an interface between the transparent conductive oxide layer 17 and the transparent foundation oxide layer 11 was analyzed from XPS analysis before annealing and, as a result, a slope of the linear function was −1.9. A grain size of the transparent oxide layer 18 after annealing was observed with AFM and, as a result, an average grain size Da was 100 nm.

Comparative Example 3

For formation of the transparent foundation oxide layer 11 and the transparent conductive oxide layer 17, indium/tin oxide (tin oxide content: 10% by weight) was used as a target. Furthermore, a temperature of a substrate in each film formation was set to 20° C. and the film was formed while a mixed gas of oxygen and argon was introduced into a device.

For formation of the transparent foundation oxide layer 11, argon and oxygen were supplied at a ratio of 100:0 by volume, and total pressure in a film-forming chamber, a power density, and a film thickness t1 were set to 0.33 Pa, 0.3 W/cm² (discharge voltage: −242 V), and 3.0 nm, respectively. Resistivity of the transparent foundation oxide layer 11 was $5.0 \times 10^{-3}$ Ωcm.

For formation of the transparent conductive oxide layer 17, argon and oxygen were supplied at a ratio of 100:5 by volume, and oxygen partial pressure, total pressure in a film-forming chamber, a power density, and a film thickness t2 were set to 0.013 Pa, 0.28 Pa, 2.5 W/cm² (discharge voltage: −285 V), and 97.0 nm, respectively. As a result, a total film thickness $t_T$ of the film thickness t1 of the transparent foundation oxide layer 11 and the film thickness t2 of the transparent conductive oxide layer 17 was 100.0 nm.

Sheet resistance was 79Ω/□ after film formation (R0), 30.1Ω/□ after annealing (R1), and 56Ω/□ after normal temperature crystallization (R2). As a result, a difference between the sheet resistance after film formation (R0) and the sheet resistance after normal temperature crystallization (R2) (R0−R2) was 23 Ω/□.

When an interface between the transparent film base material 16 and the transparent foundation oxide layer 11 was observed with TEM, unevenness, which was assumed as damage to the transparent film base material 16, was not observed in the vicinity of the interface and the interface was approximately flat.

An amount of oxygen in the vicinity of an interface between the transparent conductive oxide layer 17 and the transparent foundation oxide layer 11 was analyzed from XPS analysis before annealing and, as a result, a slope of the linear function was −0.3. A grain size of the transparent oxide layer 18 after annealing was observed with AFM and, as a result, an average grain size Da was 130 nm.

Comparative Example 4

For formation of the transparent foundation oxide layer 11 and the transparent conductive oxide layer 17, indium/tin oxide (tin oxide content: 10% by weight) was used as a target. Furthermore, a temperature of a substrate in each film formation was set to 20° C. and the film was formed while a mixed gas of oxygen and argon was introduced into a device.

For formation of the transparent foundation oxide layer 11, argon and oxygen were supplied at a ratio of 100:20 by volume, and total pressure in a film-forming chamber, a power density, and a film thickness t1 were set to 0.18 Pa, 0.5 W/cm² (discharge voltage: −268 V), and 3.0 nm, respectively. Resistivity of the transparent foundation oxide layer 11 was $5.0 \times 10^{-3}$ Ωcm.

For formation of the transparent conductive oxide layer 17, argon and oxygen were supplied at a ratio of 100:8 by volume, and oxygen partial pressure, total pressure in a film-forming chamber, a power density, and a film thickness were set to 0.015 Pa, 0.20 Pa, 2.5 W/cm² (discharge voltage: −285 V), and 97.0 nm, respectively. As a result, a total film thickness $t_T$ of the film thickness t1 of the transparent foundation oxide layer 11 and the film thickness t2 of the transparent conductive oxide layer 17 was 100.0 nm.

Sheet resistance was 80Ω/□ after film formation (R0), 35.8Ω/□ after annealing (R1), and 70Ω/□ after normal temperature crystallization (R2). As a result, a difference between the sheet resistance after film formation (R0) and the sheet resistance after normal temperature crystallization (R2) (R0−R2) was 10 Ω/□.

When an interface between the transparent film base material 16 and the transparent foundation oxide layer 11 was observed with TEM, unevenness, which was assumed as damage to the transparent film base material 16, was not observed in the vicinity of the interface and the interface was approximately flat.

An amount of oxygen in the vicinity of an interface between the transparent conductive oxide layer 17 and the transparent foundation oxide layer 11 was analyzed from XPS analysis before annealing and, as a result, a slope of the linear function was −1.5. A grain size of the transparent oxide layer 18 after annealing was observed with AFM and, as a result, an average grain size Da was 70 nm. The results are presented in Table 1.

TABLE 1

| | | | | Example | | | | Comparative example | | | |
|---|---|---|---|---|---|---|---|---|---|---|---|
| | | | | 1 | 2 | 3 | 4 | 1 | 2 | 3 | 4 |
| Sputtering target material | Tin oxide content: % by mass | | | ITO (10) | ITO (10) | ITO (10) | ITO (10) | — | Silicon oxide | ITO (10) | ITO (10) |
| Transparent oxide layer 18 | Transparent foundation oxide layer 11 | Gas introduced into film-forming chamber | Argon (Volume ratio) | 100 | 100 | 100 | 100 | — | — | 100 | 100 |
| | | | Oxygen (Volume ratio) | 0 | 0 | 0 | 0 | — | — | 0 | 20 |
| | | Oxygen partial pressure (Pa) | | 0 | 0 | 0 | 0 | — | — | 0 | 0.03 |

TABLE 1-continued

|  |  |  |  | Example | | | | Comparative example | | | |
| --- | --- | --- | --- | --- | --- | --- | --- | --- | --- | --- | --- |
|  |  |  |  | 1 | 2 | 3 | 4 | 1 | 2 | 3 | 4 |
| | | Total pressure Pu (Pa) | | 0.33 | 0.33 | 0.35 | 0.33 | — | 0.33 | 0.33 | 0.18 |
| | | Discharge voltage Vu (V) | | −268 | −268 | −268 | −268 | — | −450 | −242 | −268 |
| | | Film thickness t1 (nm) | | 3.0 | 2.0 | 3.0 | 3.0 | 0 | 3.0 | 3.0 | 3.0 |
| | | Resistivity (Ωcm) | | $5.0 \times 10^{-3}$ | $5.0 \times 10^{-3}$ | $5.0 \times 10^{-3}$ | $5.0 \times 10^{-3}$ | — | — | $5.0 \times 10^{-3}$ | $5.0 \times 10^{-3}$ |
| | Transparent conductive oxide layer 17 | Gas introduced into film-forming chamber | Argon (Volume ratio) | 100 | 100 | 100 | 100 | 100 | 100 | 100 | 100 |
| | | | Oxygen (Volume ratio) | 5 | 5 | 8 | 5 | 5 | 5 | 5 | 8 |
| | | Oxygen partial pressure (Pa) | | 0.013 | 0.013 | 0.015 | 0.015 | 0.015 | 0.015 | 0.013 | 0.015 |
| | | Total pressure Pc (Pa) | | 0.28 | 0.28 | 0.20 | 0.31 | 0.31 | 0.31 | 0.28 | 0.20 |
| | | Discharge voltage Vc (V) | | −285 | −285 | −285 | −285 | −285 | −285 | −285 | −285 |
| | | Film thickness t2 (nm) | | 97.0 | 97.0 | 97.0 | 97.0 | 100.0 | 100.0 | 97.0 | 97.0 |
| | | Slope of linear function representing oxygen content | | −0.8 | −0.9 | −0.6 | −0.8 | −2.1 | −1.9 | −0.3 | −1.5 |
| | Total film thickness $t_T$ (=t1 + t2) (nm) | | | 100.0 | 99.0 | 100.0 | 100.0 | 100.0 | 100.0 | 100.0 | 100.0 |
| | Vu/Vc | | | 0.94 | 0.94 | 0.94 | 0.94 | — | 1.61 | 0.85 | 0.94 |
| | Pu/Pc | | | 1.18 | 1.18 | 1.75 | 1.06 | — | 1.06 | 1.18 | 0.90 |
| | Sheet resistance (Ω/□) | R0 | | 61 | 67 | 72 | 66 | 92 | 109 | 79 | 80 |
| | | R1 | | 20 | 20 | 20 | 20 | 34 | 37 | 30 | 36 |
| | | R2 | | 56 | 61 | 60 | 61 | 70 | 52 | 56 | 70 |
| | | R0 − R2 | | 5 | 6 | 12 | 5 | 22 | 57 | 23 | 10 |
| Transparent oxide layer after annealing 18 | Average grain size Da (Nm) | | | 180 | 160 | 200 | 180 | 90 | 100 | 130 | 70 |
| | Da/$t_T$ | | | 1.80 | 1.62 | 2.00 | 1.80 | 0.90 | 0.97 | 1.30 | 0.70 |

[General Comment on Result]

When all Examples (Examples 1 to 4) were compared to Comparative Example 1, all Examples had sheet resistance of the transparent oxide layer 18 after annealing (R1) of 19.9 to 20.3Ω/□ due to the presence of the transparent foundation oxide layer 11, which was much lower than sheet resistance of the transparent oxide layer 18 after annealing (R1) of Comparative Example 1 without the transparent foundation oxide layer 11 (34.2Ω/□). Furthermore, in Example 1, the interface between the transparent film base material 16 and the transparent foundation oxide layer 11 was approximately flat as shown in FIG. 4, and in Examples 2 to 4, the interface between the transparent film base material 16 and the transparent foundation oxide layer 11 was also approximately flat similar to Example 1. It is believed that this is because magnetic field strength in a discharge field was increased by increasing a magnet intensity used for magnetron sputtering, resulting in a decrease in a discharge voltage. Thus, the transparent foundation oxide layer 11 was believed to be formed so as to give only low damage to the transparent film base material 16.

Unlike the structures indented into each other at the interface as in Comparative Example 2 shown in FIG. 5 and Comparative Examples 1 and 3, all Examples (Examples 1 to 4) had approximately flat interfaces between the transparent film base material 16 and the transparent foundation oxide layer 11 as shown in FIG. 4, so that the transparent oxide layers 18 were crystalline films with overall good quality. Therefore, the sheet resistance of the transparent oxide layer 18 after annealing (R1) was able to be low.

Furthermore, when Examples 1 to 4 were compared, Examples 1, 2, and 4 had a slope of the linear function which was relatively low, i.e., −0.8 or −0.9. In other words, an absolute value of the slope is high had a smaller difference between sheet resistance after film formation and sheet resistance after normal temperature crystallization (R0−R2) and a smaller change in sheet resistance between after film formation and after normal temperature crystallization compared to Example 3 of which slope of the linear function was relatively high of −0.6. In other words, an absolute value of the slope of Example 3 is low.

Moreover, Comparative Example 2 was confirmed to exhibit high sheet resistance in the transparent oxide layer 18 after annealing (R1) of 36.7Ω/□ due to use of silicon oxide as the transparent foundation oxide layer 11. Comparative Example 2 had an average grain size Da of 100 nm which was smaller than that of Examples 1 to 4. Therefore, it was confirmed that geometry of the interface between the transparent film base material 16 and the transparent foundation oxide layer 11 was important.

Comparative Example 3 had an absolute value of a discharge voltage upon film formation of the transparent foundation oxide layer 11 (242 V) which was excessively smaller than that upon film formation of the transparent conductive oxide layer 17 (285 V). Comparative Example 3 was confirmed to have high sheet resistance of the transparent oxide layer 18 after annealing (R1) of 30.1Ω/□. The reason why Comparative Example 3 had higher sheet resistance of the transparent oxide layer 18 (R1) than those of the Examples is believed to be because the transparent foundation oxide layer 11 in Comparative Example 3 had low voltage resistance against high discharge voltage Vc upon film formation of the transparent conductive oxide layer 17. Therefore, the transparent foundation oxide layer 11 was damaged in a plasma process upon film formation of the transparent conductive oxide layer 17.

In Comparative Example 4, an excessive amount of oxygen was introduced when the transparent foundation oxide layer 11 was formed. In this process, the interface between the transparent film base material 16 and the transparent foundation oxide layer 11 was approximately flat, but sheet resistance of the transparent oxide layer 18 after annealing (R1) was confirmed to have a maximum of 35.8Ω/□. It is believed that this is because the transparent foundation oxide layer 11 formed in this process was crystalline, which affected crystallization through annealing to thereby decrease an average grain size Da of the transparent oxide layer 18 overall to 70 nm, or in other words, increase the number of grain boundaries, so that electron transport was easily inhibited and the sheet resistance (R1) was increased.

The invention claimed is:

1. A method for producing a substrate with a transparent electrode, the method comprising:
    forming a transparent oxide layer on a film base material; wherein
    the film base material comprises a transparent film substrate,
    the transparent oxide layer comprises an amorphous transparent foundation oxide layer and an amorphous transparent conductive oxide layer formed sequentially on the film base material through a sputtering method,
    an absolute value of a discharge voltage ($V_U$) when a direct-current (DC) power supply applies a voltage upon formation of the transparent foundation oxide layer is 255 V or more and 280 V or less and a ratio ($V_U/V_C$) of the discharge voltage ($V_U$) to a discharge voltage $V_C$ when the DC power supply applies a voltage upon formation of the transparent conductive oxide layer being 0.86 or more and 0.98 or less, and
    an oxygen partial pressure upon formation of the transparent conductive oxide layer is higher than an oxygen partial pressure upon formation of the transparent foundation oxide layer.

2. The method for producing a substrate with a transparent electrode according to claim 1, wherein a ratio (Pu/Pc) of a film-forming pressure (Pu) upon formation of the transparent foundation oxide layer to a film-forming pressure (Pc) upon formation of the transparent conductive oxide layer satisfies a relational expression: $1.0 \leq Pu/Pc \leq 2.5$.

3. The method for producing a substrate with a transparent electrode according to claim 1, wherein a film thickness (t1) of the transparent foundation oxide layer is 1.5% or more and 3.0% or less of a film thickness ($t_T$) of the transparent oxide layer.

4. The method for producing a substrate with a transparent electrode according to claim 1, wherein
    the transparent oxide layer is formed by the sputtering method and then the substrate with a transparent electrode is crystallized through an annealing treatment, and
    the transparent oxide layer has an average grain size (Da), being an average value of grain size when observed from a surface opposite to the film base material, of 1.5 times or more and 2.5 times or less the film thickness ($t_T$) of the transparent oxide layer.

5. The method for producing a substrate with a transparent electrode according to claim 1, wherein
    the transparent foundation oxide layer is formed from a raw material having the same composition as that of the transparent conductive oxide layer, and
    the raw material is indium tin oxide.

6. The method for producing a substrate with a transparent electrode according to claim 5, wherein
    the indium tin oxide is indium oxide added with tin oxide, and
    the tin oxide is added in an amount of 8.2% by mass or more and 11.2% by mass or less.

7. A method for producing a substrate with a transparent electrode, the method comprising:
    forming a transparent oxide layer on a film base material; wherein
    the transparent oxide layer comprises an amorphous transparent foundation oxide layer and an amorphous transparent conductive oxide layer formed sequentially on the film base material through a sputtering method,
    an absolute value of a discharge voltage ($V_U$) when a direct-current (DC) power supply applies a voltage upon formation of the transparent foundation oxide layer is 255 V or more and 280 V or less and a ratio ($V_U/V_C$) of the discharge voltage ($V_U$) to a discharge voltage ($V_C$) when the DC power supply applies a voltage upon formation of the transparent conductive oxide layer is 0.86 or more and 0.98 or less, and
    a ratio (Pu/Pc) of a film-forming pressure (Pu) upon formation of the transparent foundation oxide layer to a film-forming pressure (Pc) upon formation of the transparent conductive oxide layer satisfies a relational expression: $1.0 \leq Pu/Pc \leq 2.5$.

8. The method for producing a substrate with a transparent electrode according to claim 7, wherein a film thickness (t1) of the transparent foundation oxide layer is 1.5% or more and 3.0% or less of a film thickness ($t_T$) of the transparent oxide layer.

9. The method for producing a substrate with a transparent electrode according to claim 2, wherein a film thickness (t1) of the transparent foundation oxide layer is 1.5% or more and 3.0% or less of a film thickness ($t_T$) of the transparent oxide layer.

10. The method for producing a substrate with a transparent electrode according to claim 7, wherein
    the transparent oxide layer is formed by the sputtering method and then the substrate with a transparent electrode is crystallized through an annealing treatment, and
    the transparent oxide layer has an average grain size (Da), being an average value of grain size when observed from a surface opposite to the film base material, of 1.5 times or more and 2.5 times or less the film thickness ($t_T$) of the transparent oxide layer.

11. The method for producing a substrate with a transparent electrode according to claim 2, wherein
    the transparent oxide layer is formed by the sputtering method and then the substrate with a transparent electrode is crystallized through an annealing treatment, and
    the transparent oxide layer has an average grain size (Da), being an average value of grain size when observed from a surface opposite to the film base material, of 1.5 times or more and 2.5 times or less the film thickness ($t_T$) of the transparent oxide layer.

12. The method for producing a substrate with a transparent electrode according to claim 3, wherein the transparent oxide layer is formed by the sputtering method and then the substrate with a transparent electrode is crystallized through an annealing treatment, and the transparent oxide layer has an average grain size (Da), being an average value of grain size when observed from a surface opposite to the film base material, of 1.5 times or more and 2.5 times or less the film thickness ($t_T$) of the transparent oxide layer.

13. The method for producing a substrate with a transparent electrode according to claim 7, wherein
the transparent foundation oxide layer is formed from a raw material having the same composition as that of the transparent conductive oxide layer, and
the raw material is indium tin oxide.

14. The method for producing a substrate with a transparent electrode according to claim 2, wherein
the transparent foundation oxide layer is formed from a raw material having the same composition as that of the transparent conductive oxide layer, and
the raw material is indium tin oxide.

15. The method for producing a substrate with a transparent electrode according to claim 3, wherein
the transparent foundation oxide layer is formed from a raw material having the same composition as that of the transparent conductive oxide layer, and
the raw material is indium tin oxide.

16. The method for producing a substrate with a transparent electrode according to claim 4, wherein
the transparent foundation oxide layer is formed from a raw material having the same composition as that of the transparent conductive oxide layer, and
the raw material is indium tin oxide.

17. A substrate with a transparent electrode comprising:
a film base material; and
a transparent oxide layer on the film base material, wherein
the transparent oxide layer comprises an amorphous transparent foundation oxide layer and an amorphous transparent conductive oxide layer formed sequentially on the film base material, and
an oxygen content as measured by X-ray photoelectron spectroscopy is linearly approximated by a linear function having a slope monotonically decreasing towards the transparent foundation oxide layer and the slope being −1.0 or more and −0.5 or less in a region from an interface between the transparent conductive oxide layer and the transparent foundation oxide layer to a position 10 nm away from the interface towards the transparent conductive oxide layer when viewed in a cross-section of the substrate with a transparent electrode.

* * * * *